United States Patent [19]
Igarashi et al.

[11] Patent Number: 5,900,781
[45] Date of Patent: May 4, 1999

[54] MULTISTAGE VARIABLE GAIN AMPLIFIER CIRCUIT

[75] Inventors: Sadao Igarashi; Kazuharu Aoki; Satoshi Urabe, all of Fukushima-ken, Japan

[73] Assignee: Alps Electric Co., Ltd., Tokyo, Japan

[21] Appl. No.: 08/814,250

[22] Filed: Mar. 11, 1997

[30] Foreign Application Priority Data

Mar. 29, 1996 [JP] Japan .................................. 8-077096

[51] Int. Cl.⁶ ....................................................... H03F 3/45
[52] U.S. Cl. ........................................... 330/254; 330/310
[58] Field of Search ..................................... 330/254, 310, 330/278; 327/359

[56] References Cited

U.S. PATENT DOCUMENTS

| | | | |
|---|---|---|---|
| 3,684,974 | 8/1972 | Solomon et al. ........................ | 330/254 |
| 4,287,476 | 9/1981 | Cense ....................................... | 330/254 |
| 5,115,317 | 5/1992 | Igarashi et al. ........................ | 358/191.1 |
| 5,206,606 | 4/1993 | Yanaguchi et al. ..................... | 330/254 |

FOREIGN PATENT DOCUMENTS 0185410  9/1985  Japan ...................................... 330/254

*Primary Examiner*—Steven Mottola
*Attorney, Agent, or Firm*—Brinks Hofer Gilson & Lione

[57] ABSTRACT

A multistage amplifier circuit comprises a current constant mode variable amplifying circuit for amplifying an input signal and current variable mode variable amplifying circuits and for further amplifying the signal amplified by the first variable amplifying circuit. An AGC voltage VAGC is commonly applied between the bases and emitters of an amplification degree control transistor of the current constant mode variable amplifying circuit and amplification degree control transistors of the current variable mode amplifying circuits. Collector currents of the transistors change exponentially with respect to the linearly-varied AGC voltage VAGC. Further, currents each proportional to the collector current of the transistor flow in the transistors. Thus, the gain PG [dB] of the current constant mode variable amplifying circuit changes linearly with the AGC voltage VAGC.

6 Claims, 5 Drawing Sheets

MULTISTAGE VARIABLE GAIN AMPLIFIER CIRCUIT

BACKGROUND OF THE INVENTION

1. Field of the Invention

The present invention relates to a multistage variable gain amplifier circuit suitable for radio-frequency amplifying circuits of, for example, a CDMA (Code Division Multiple Access) mode portable telephone.

2. Description of the Related Art

In a CDMA mode portable telephone, variable gain amplifying circuits (hereinafter called "variable amplifying circuits") capable of varying a gain of 80 dB or above are normally provided at radio-frequency amplifying circuits of a transmitter unit and a receiver unit, respectively, in order to maintain communication when the portable telephone moves. FIG. 4 shows a radio frequency stage of a portable telephone having general CDMA and FM dual modes. A description will first be made of a configuration of a transmission (TX) system. An IF (intermediate frequency) transmit signal modulated by a modem 101 is QPSK-modulated by a QPSK modulating circuit 102. Next, the modulated signal is amplified by a transmitter variable amplifying circuit (TX-AMP) 103, which in turn is mixed into a local oscillating frequency produced from a local oscillator (OSC) 121 by a mixer (MIX) 104, where the mixed signal is converted into an RF (radio frequency) transmit signal. The RF transmit signal is transmitted through a band-pass filter 105, a power amplifier (PA) 106, a duplexer 107 and an antenna 108.

A description will next be made of a configuration of a reception (RX) system. An RF receive signal received by the antenna 108 is applied to a mixer (MIX) 111 through the duplexer 107, a low noise amplifier (LNA) 109 and a band-pass filter 110, where the signal is mixed into a local oscillating frequency generated from the local oscillator (OSC) 121 converting the signal into an IF receive signal. The IF receive signal is applied to a CDMA band-pass filter 112 and an FM band-pass filter 113, where one output signal is selected according to a set mode and amplified by a receiver variable amplifying circuit (RX-AMP) 114. Next, the amplified signal is demodulated by a QPSK demodulating circuit 115, and then provided to the modem 101.

The strength of the received signal, which has been detected by a receive-signal strength indicating circuit (RSSI) 116 provided within the modem 101 is compared with strength reference data by a comparator 117. The difference in strength therebetween is applied to a receiver AGC voltage correction circuit 118 and a transmitting output correction circuit 119. The AGC voltage correction circuit 118 outputs an AGC output so that the difference produced from the comparator 117 becomes "0," i.e., the output of the RSSI 116 coincides with the strength reference data, thereby controlling the gain of the variable amplifying circuit (RX-AMP) 114 on the receiving side. The difference produced from the comparator 117 and transmitting output correction data determined according to circuit conditions between a portable telephone and a base station are applied to the transmitting output correction circuit 119 on the transmitting side. An AGC voltage correction circuit 120 on the transmitting side outputs an AGC voltage so that a modulated signal is inversely proportional to the level of the received signal, and according to the transmitting output correction data, thereby controlling the gain of the variable amplifying circuit (TX-AMP) 103 on the transmitting side.

In this case, excellent linearity is required between the AGC voltage and the gain over a dynamic range of 80 dB or above in order to allow the variable amplifying circuits 103 and 114 on the transmitting and receiving sides to operate in interlock with each other. Since the portable telephone is driven by a battery, the battery power decreases as current consumption increases. As a result, a problem arises in that, for example, standby time and call duration are reduced and the battery must be replaced frequently. It is thus desired that the variable amplifying circuits 103 and 114 also provide current consumption as low as possible.

There are known current constant mode and current variable mode variable amplifying circuits whose differential amplifiers are respectively connected to constant-current sources. The range in which the gain can be linearly controlled, is normally about 20 dB to 30 dB in a variable amplifying circuit of one stage. A method of cascade-connecting variable amplifying circuits of the same type in three to four stages on a radio-frequency basis and parallel applying an AGC voltage to the respective variable amplifying circuits allows a dynamic range of gain of 80 dB or above.

FIGS. 5 and 6 respectively show commonly-used current constant mode and current variable mode variable amplifying circuits each composed of bipolar transistors. Symbols IN, OUT, VAGC and Vcc denote an input, an output, an AGC voltage and a power source voltage respectively. FIG. 7 shows the gain PG with respect to the AGC voltage VAGC, in which g represents a characteristic of the current constant mode variable amplifying circuit and h presents a characteristic of the current variable mode variable amplifying circuit.

In the current constant mode shown in FIG. 5, gain variable transistors Q1, Q2, Q3 and Q4 and amplifying transistors Q5 and Q6 constitute a differential amplifier. Further, resistors R1 and R2 are respectively load resistors for the transistors Q1 and Q4, E1 is a bias supply or source, and CS1 is a constant-current source.

The gain PG [dB] of the current constant mode shown in FIG. 5 is represented by the following expression:

$$PG\ PGO + 20\ \log\ (I1/I0) \tag{1}$$

where PGO indicates gain at the time that I1 is I0. Further, the relationship between I1 and I0 (I1/I0) is represented by the following expression:

$$I1/I0\ [1+\exp\{-VAGC^*q/(kT)\}] \tag{2}$$

where q: unit charge of electron k: Boltzmann constant, and

T: absolute temperature.

The gain PG of the characteristic g does not change linearly when the AGC voltage VAGC is large. In the current constant mode, the amount of tertiary distortion caused by interference or disturbing waves is kept constant regardless of the magnitude of the gain PG. Further, the current consumption is also held constant regardless of the magnitude of the gain PG. In the variable amplifying circuit of a type wherein the current constant mode shown in FIG. 5 is connected in multistage form, the relationship between input intercept points and current consumption with respect to the gain PG is represented in the form of characteristics a and b in FIG. 3. The input intercept point characteristic a in a low range of gain PG is but the current consumption characteristic b is constant.

The current variable mode shown in FIG. 6 comprises gain variable transistors Q7 and Q8, a transistor Q15 for a constant current circuit, and load resistors R3 and R4 for the transistors Q7 and Q8. The gain PG [dB] of the current variable mode is represented by the following expression:

$$PG\ 20\ \log\ (I2) \quad (3)$$

Further, I2 is represented as follows:

$$I2\ \exp\{VAGC*q/(kT)\} \quad (4)$$

Substituting the expression (4) in the expression (3) yields:
PG VAGC

As indicated by the curve h in FIG. 7, the gain PG changes linearly with the AGC voltage VAGC. In the variable amplifying circuit of a type wherein the current variable mode is connected in multistage form, the relationship between input intercept points and current consumption with respect to the gain PG is represented in the form of characteristics c and d in FIG. 3. Since a collector current is small, distortion is apt to appear.

However, the variable amplifying circuit in which the current constant mode shown in FIG. 5 is connected in multistage form, has a problem in that the current consumption is large as compared with the current variable mode as indicated by b and d in FIG. 3.

Further, the variable amplifying circuit in which the current variable mode shown in FIG. 6 is connected in multistage form, has a problem in that although the current consumption is small as compared with the current constant mode, the input intercept points deteriorated in the low range of gain PG as compared with the current constant mode as indicated by a and c in FIG. 3. As a result, when a strong electric field is present, other stations will interfere with the corresponding circuit.

In a configuration in which the current constant mode and the current variable mode are cascade-connected, the current constant mode is different in AGC voltage VAGC from the current variable mode. Further, they are different from each other in the characteristic of the gain PG with respect to the AGC voltage VAGC. Therefore, the linearity of gain PG deteriorates.

SUMMARY OF THE INVENTION

With the foregoing problems in view, it is an object of the present invention to provide a multistage variable amplifier circuit capable of reducing current consumption and improving input intercept points and gain linearity.

In order to achieve the above object, the present invention features a current constant mode variable gain amplifying circuit (hereinafter called "variable amplifying circuit") connected as a pre-stage and a current variable mode variable amplifying circuit connected as a stage subsequent to the variable amplifying circuit, and an AGC voltage converted into an exponentially-varied current, which in turn is applied as a drive current used for each variable amplifying circuit to control each amplification degree.

According to the present invention, the tertiary distortion component can be reduced by disposing the current constant mode variable amplifying circuit in the pre-stage. Further, the current consumption and the distortion component can be reduced by providing the current variable mode variable amplifying circuit in the subsequent stage. In this case, each variable amplifying circuit serves as an attenuator when an input signal is large. In the post-stage current variable mode variable amplifying circuit, the drive current is reduced and the tertiary distortion component is apt to increase. However, an interference signal corresponding to a distortion generating source is attenuated by the pre-stage current constant mode variable amplifying circuit, followed by application to the post-stage current variable mode variable amplifying circuit, so that the tertiary distortion component is not increased. When the input signal is small, each variable amplifying circuit serves as an amplifier and the interference signal is amplified by the pre-stage current constant mode variable amplifying circuit. However, since the drive current for the post-stage current variable mode variable amplifying circuit is large, the tertiary distortion component is not increased.

Since the linearly-varied AGC voltage is converted to the exponentially-varied current, which in turn is supplied to the current constant mode variable amplifying circuit, the current constant mode variable amplifying circuit becomes identical in amplification characteristic to the current variable mode variable amplifying circuit. As a result, the amplification the two types of variable amplifying circuits are varied so as to be substantially proportional to each other. It is therefore possible to linearly control the gain.

A preferred embodiment of the present invention comprises a first variable gain amplifying circuit comprised of an unbalanced output type differential amplifier and driven by a constant drive current so as to amplify a signal inputted thereto, first amplification degree control means for controlling an amplification degree of the first variable gain amplifying circuit, a second variable gain amplifying circuit composed of a balance output type differential amplifier and driven by a variable drive current so as to further amplify the signal amplified by the first variable gain amplifying circuit, and second amplification degree control means for controlling an amplification degree of the second variable gain amplifying circuit.

Each of the first and second amplification degree control means is characterized in that a linearly-varied AGC voltage is converted into an exponentially-varied control current and the control current is supplied to each of the first and second variable gain amplifying circuits as a drive current.

Further, the unbalanced output type differential amplifier has at least one pair of transistors whose emitters are electrically connected to a common constant-current source and supplied with a signal through the emitters thereof, and is characterized in that the base of one of the transistor pair is supplied with an AGC voltage, whereas the base of the other transistor is grounded, and the collector of one of the transistors outputs a signal therefrom.

The first amplification degree control means includes a voltage-current converting transistor for translating a change in the AGC voltage applied to the base of the transistor into a change in collector current, and a current mirror circuit including the transistor, and is characterized in that a current corresponding to the collector current is caused to flow in the collector of the transistor.

DESCRIPTION OF THE PREFERRED EMBODIMENT

Figure 1:
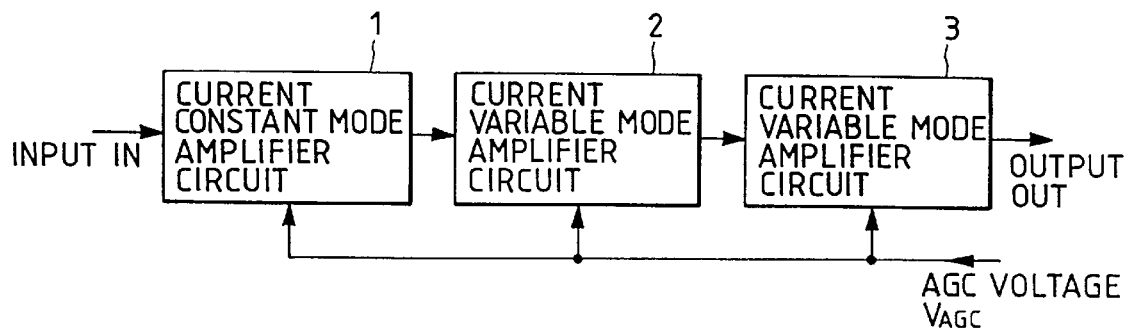
FIG. 1 is a block diagram showing one embodiment of a multistage variable gain amplifier circuit according to the present invention.
Figure 2:
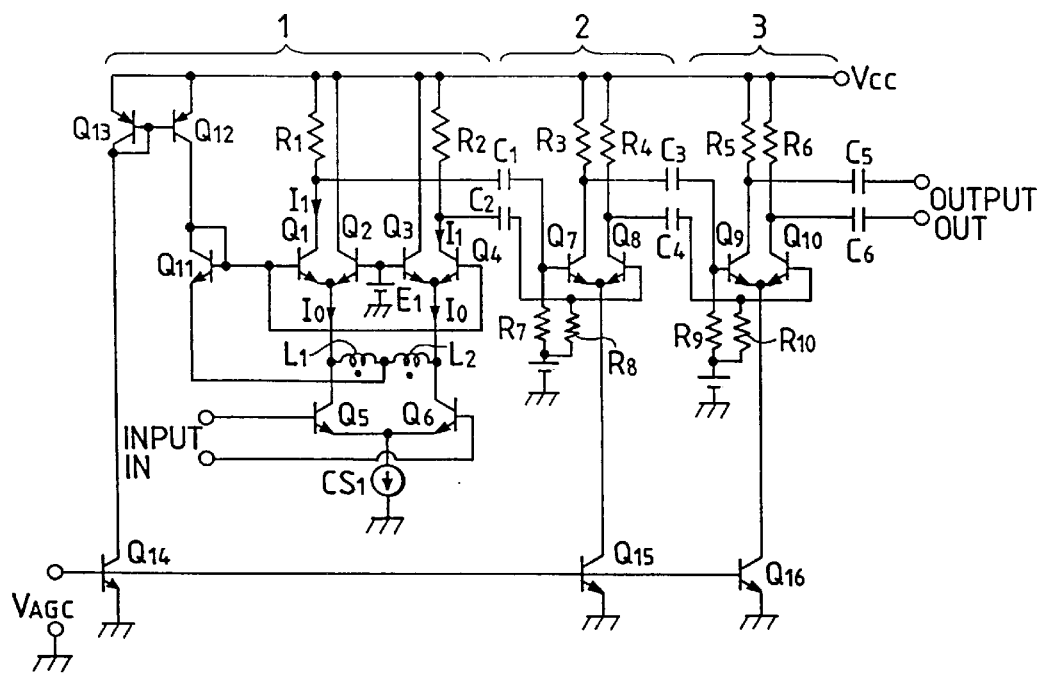
FIG. 2 is a circuit diagram illustrating the circuit FIG. 1 in detail.
Figure 3:
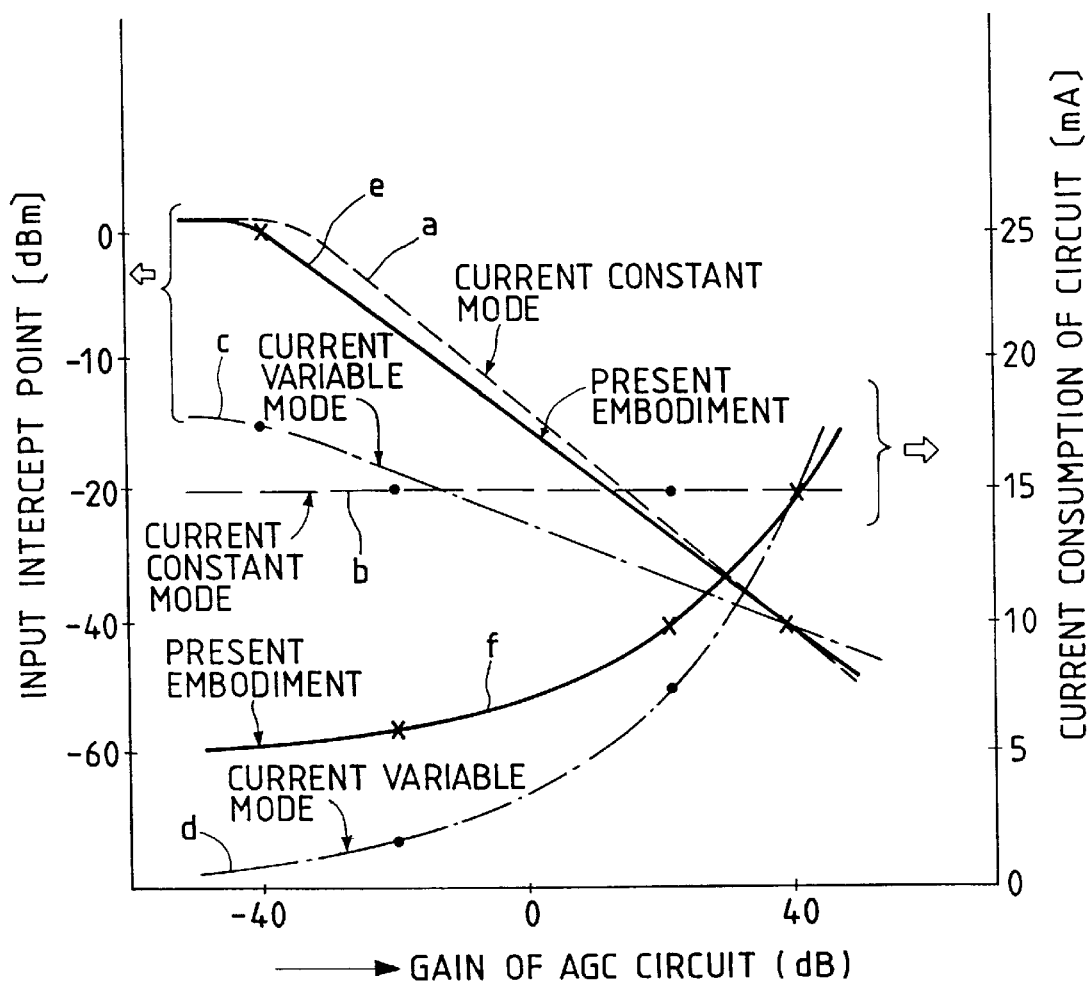
FIG. 3 is a diagram for describing comparisons between input intercept point characteristics and current consumption with respect to gain obtained in the circuit shown in FIGS. 1 and 2 and the prior art.
Figure 4:
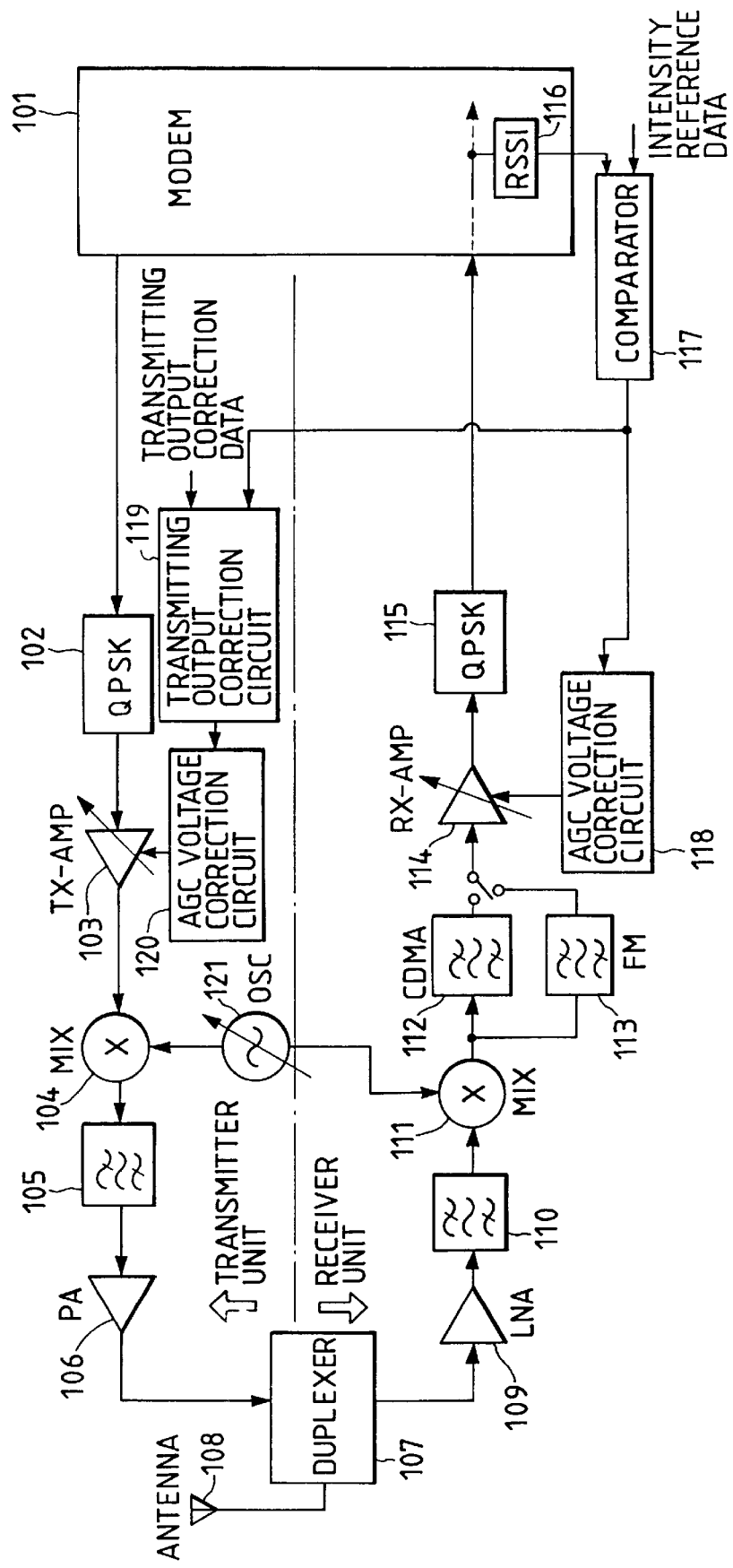
FIG. 4 is a block diagram showing an RF stage of a general CD mode portable telephone to which the multistage variable gain amplifier circuit according to the present invention is applied.
Figure 5:
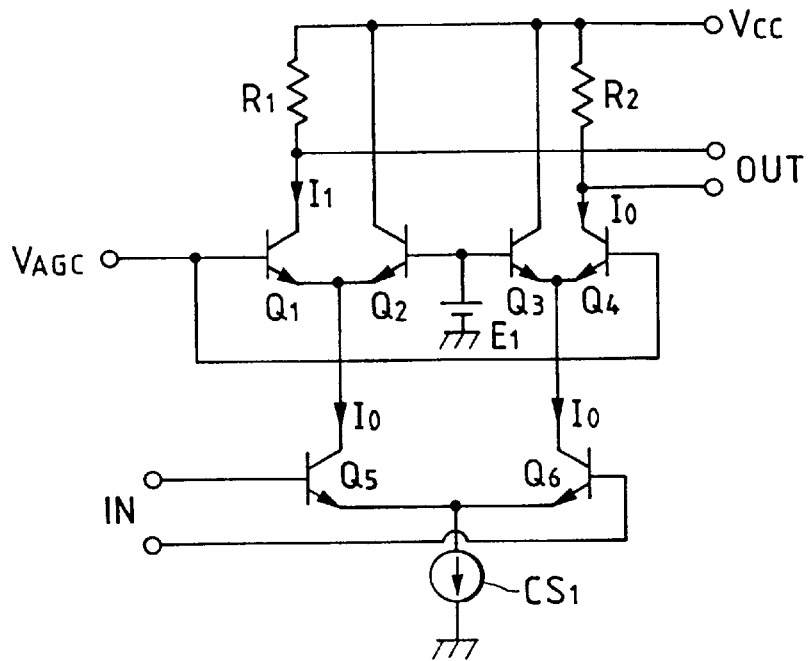
FIG. 5 is a circuit diagram illustrating a commonly-used current constant mode variable amplifying circuit.
Figure 6:
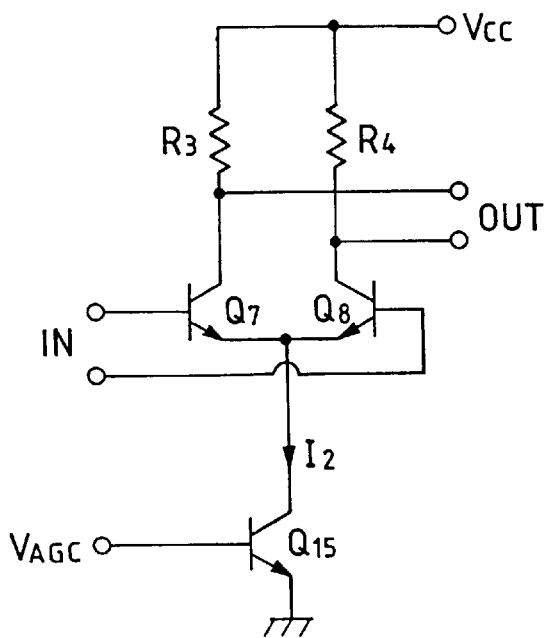
FIG. 6 is a circuit diagram showing a commonly-used current variable mode variable amplifying circuit.
Figure 7:
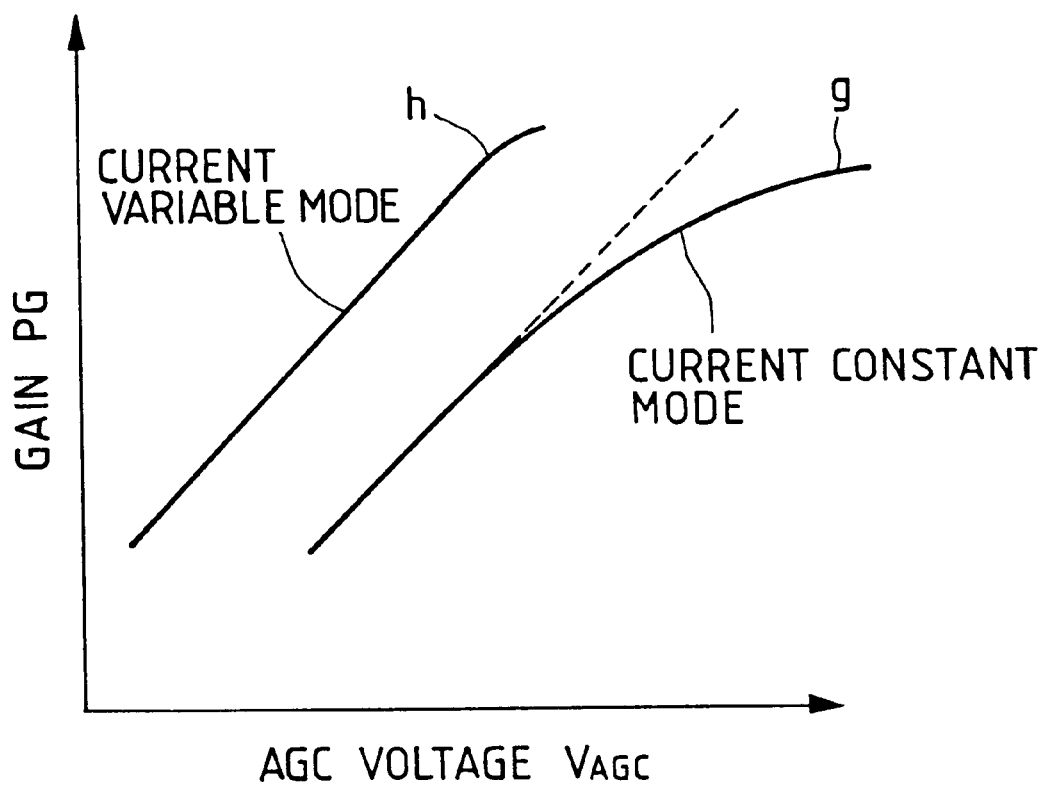
FIG. 7 is a diagram for explaining control voltage vs. gain chacteristics of the variable amplifying circuits shown in FIGS. 5 and 6.

A preferred embodiment of the present invention will hereinafter be described with reference to the accompanying drawings. FIG. 1 is a block diagram showing one embodiment of a multistage variable amplifier circuit according to the present invention. FIG. 2 is a circuit diagram showing the circuit of FIG. 1 in detail. FIG. 3 is a diagram for describing comparisons between input intercept point characteristics and current consumption with respect to gain obtained in the circuit shown in FIG. 2 and the prior art.

Referring to FIG. 1, an AGC voltage VAGC is commonly applied to a current constant mode variable amplifying circuit 1 and current variable mode variable amplifying circuits 2 and 3. The current constant mode variable amplifying circuit 1 amplifies an input signal IN based on the AGC voltage VAGC. The current variable mode variable amplifying circuit 2 further amplifies the signal amplified by the current constant mode variable amplifying circuit 1. Further, the current variable mode variable amplifying circuit 3 still further amplifies the signal amplified by the current variable mode variable amplifying circuit 2 and outputs it as an output signal OUT therefrom.

A detailed structure will be described with reference to FIG. 2. A power source voltage Vcc is first applied to the emitters of PNP transistors Q13 and Q12, one end of a bias resistor R1, the collectors of NPN transistors Q2 and Q3, and one end of bias resistors R1, R2, R3, R4, R5 and R6. The AGC voltage VAGC is commonly applied between the bases and emitters of NPN transistors Q14, Q15 and Q16. The input signal IN is applied between the bases of NPN transistors Q5 and Q6. The output signal OUT is across coupling capacitors C5 and C6.

A further description will be made of the current constant mode variable amplifying circuit 1. The bases of the transistors Q12 and Q13 are electrically connected to their corresponding collectors of the transistors Q13 and Q14. The collector of the transistor Q12 is electrically connected to the collector and base of an NPN transistor Q11 and the bases of NPN transistors Q1 and Q4. The other end of the resistor R1 is electrically connected to the collector of the transistor Q1. The emitters (currents I0) of the transistors Q1 and Q2 are electrically connected to one end of an inductance L1 and the collector of the transistor Q5.

The other end (current I1) of the resistor R2 is electrically connected to the collector of the transistor Q4. The emitters of the transistors Q3 and Q4 are electrically connected to one end of an inductance L2 and the collector of the transistor Q6. The bases of the transistors Q2 and Q3 are grounded via a bias source E1. A point at which the inductances L1 and L2 are connected to each other, is electrically connected to the emitter of the transistor Q11. The emitters of the transistors Q5 and Q6 are grounded via a constant-current source CS1.

A description will next be made of the current variable mode variable amplifying circuit 2 corresponding to a second stage. The other end of the resistor R1 is electrically connected to the base of an NPN transistor Q7 through a coupling capacitor C1 and grounded via a bias resistor R7. The other end of the resistor R2 is electrically connected to the base of an NPN transistor Q8 through a coupling capacitor C2 and grounded via a bias resistor R8. The other ends of the resistors R3 and R4 are respectively electrically connected to the collectors of the transistors Q7 and Q8. The emitters of the transistors Q7 and Q8 are electrically connected to the collector of the transistor Q15.

The current variable mode variable amplifying circuit 3 corresponding to a third stage is configured in the same manner as described above. Namely, the other end of the resistor R3 is also electrically connected to the base of an NPN transistor Q9 through a coupling capacitor C3 and grounded via a bias resistor R9. The other end of the resistor R4 is also electrically connected to the base of an NPN transistor Q10 through a coupling capacitor C4 and grounded via a bias resistor R10. The other ends of the resistors R5 and R6 are respectively electrically connected to the collectors of the transistors Q9 and Q10 and the coupling capacitors C5 and C6. The emitters of the transistors Q9 and Q10 are electrically connected to the collector of the transistor Q16.

In the current constant mode variable amplifying circuit 1, the transistors Q1 through Q4 are used for varying the gain and the transistors Q5 and Q6 are used for amplification. The transistor Q11 constitutes a current mirror circuit in a manner similar to the transistors Q1 and Q4. A cell size of the transistor Q11 is set to 1/50 the cell size of each of the transistors Q1 and Q4 so that the current flowing through the transistor Q11 does not lessen the dynamic range of each of the transistors Q1 through Q4. Similarly, the transistors Q12 and Q13 also constitute a current mirror circuit. The inductances L1 and L2 are used for blocking of RF and may be resistors rather than inductances. Since the input impedances of the transistors Q1 through Q4 are low, their resistance values may be small.

The transistors Q7 and Q8 employed in the current variable mode variable amplifying circuit 2 corresponding to the second stage and the transistors Q9 and Q10 employed in the current variable mode variable amplifying circuit 3 corresponding to the third stage are of radio-frequency transistors. Further, the transistor Q15 employed in the second stage and the transistor Q16 employed in the third stage are respectively used to restrict the currents flowing through the transistors (Q7, Q8) and (Q9, Q10). In this case, the cell size of each of the transistors Q15 and Q16 is set to 100 times the cell size of the transistor Q14 so that the currents flowing through the transistors Q7, Q8, Q9, Q10, Q1 and Q4 are equal to each other.

The operation of the above-described embodiment will next be described. In the current constant mode variable amplifying circuit 1, the current that flows through the transistor Q14, first changes exponentially with respect to the AGC voltage VAGC. Since the transistor Q13 serves as a load of the transistor Q14, the same current as the transistor Q14 flows in the transistor Q13. Since the transistors Q12 and Q13 constitute the current mirror circuit in this case, the same current as the transistor Q13 flows in the transistor Q12.

Since the transistor Q11 serves as a load for the collector of the transistor Q12, the same current as the transistor Q12 flows in the transistor Q11. Further, since the transistors Q1 and Q4 constitute the current mirror circuit in a manner similar to the transistor Q11, the same current as the transistor Q11 flows in the transistors Q1 and Q4. Accordingly, a collector current proportional to the collector current of the transistor Q14 to which the AGC voltage VAGC is applied, flows in each of the transistors Q1 and Q4. The collector current changes exponentially with respect to the AGC voltage VAGC. As a result, the gain PG [dB] of the current constant mode variable amplifying circuit 1 changes linearly with the AGC voltage VAGC.

Similarly even in the case of the transistor Q15 employed in the second stage and the transistor Q16 employed in the third stage, the collector current changes exponentially with respect to the AGC voltage VAGC. As a result, the gain PG varies linearly with the AGC voltage VAGC throughout the first to third stages.

Referring to FIG. 3, the abscissa indicates gain PG [dB], the ordinate on the left side indicates an input intercept point, and the ordinate on the right side indicates current consumption. An input intercept point characteristic e obtained in the above-described embodiment is substantially identical to a current constant mode characteristic a and larger than a current variable mode characteristic c. Further, a current consumption characteristic f obtained in the above-described embodiment is larger than a current variable mode characteristic d but can be reduced as compared with a current constant mode characteristic b.

When the level of the input signal IN is large (i.e., when the gain PG is low), the individual variable amplifying circuits 1 through 3 serve as attenuators. Further, the current variable mode variable amplifying circuits 2 and 3 provides less drive current and are apt to increase produced tertiary distortion components. However, according to the above-described embodiment, an interference signal, which is a distortion generating source, is attenuated by the current constant mode variable amplifying circuit 1, followed by inputting to the current variable mode variable amplifying circuits 2 and 3. It is therefore possible to reduce the tertiary distortion components produced in the current variable mode variable amplifying circuits 2 and 3.

On the other hand, when the level of the input signal IN is low (i.e., when the gain PG is large), the respective variable amplifying circuits 1 through 3 serve as amplifiers. Further, an interference signal corresponding to a distortion generating source is amplified by the current constant mode variable amplifying circuit 1, which is then input to the current variable mode variable amplifying circuits 2 and 3. However, according to the above-described embodiment, since the operating currents of the current variable mode variable amplifying circuits 2 and 3 are large at this time, tertiary distortion components produced therein are small. Although the amplification degree of the current constant mode variable amplifying circuit 1 changes according to the magnitude of the level of the input signal IN, the magnitude of the produced tertiary distortion components is constant because the drive current is constant.

According to the present invention, as has been described above, a current constant mode variable amplifying circuit is connected as a pre-stage and a current variable mode variable amplifying circuit is connected as a post-stage. Further, a linearly-varied AGC voltage is converted into an exponentially-varied current, which in turn is applied as a drive current used for each variable amplifying circuit so as to control each amplification degree. Therefore, current consumption is reduced, and input intercept points and gain linearity are improved.

What is claimed is:

1. A multistage variable gain amplifier circuit comprising:

a first variable gain amplifying circuit comprised of an unbalanced output type differential amplifier and driven by a constant drive current so as to amplify a signal inputted thereto;

first amplification degree control means for controlling an amplification degree of said first variable gain amplifying circuit;

a second variable gain amplifying circuit composed of a balance output type differential amplifier and driven by a variable drive current so as to further amplify the signal amplified by said first variable gain amplifying circuit; and second amplification degree control means for controlling an amplification degree of said second variable gain amplifying circuit.

2. A multistage variable gain amplifier circuit as claimed in claim 1, wherein said each amplification degree control means converts a linearly-varied AGC voltage into an exponentially-varied control current and supplies the control current to said each variable gain amplifying circuit as a drive current.

3. A multistage variable gain amplifier circuit as claimed in claim 1, wherein said unbalanced output type differential amplifier has at least one pair of transistors whose emitters electrically connected to a common constant-current source and supplied with a signal through the emitters thereof, said one transistor having a base supplied with an AGC voltage, said other transistor having a base electrically connected to ground via a bias source, and said one or other transistor having a collector for outputting a signal therefrom.

4. A multistage variable gain amplifier circuit as claimed in claim 3, wherein said first amplification degree control means includes a voltage-current converting transistor for translating a change in the AGC voltage applied to the base of said one transistor into a change in collector current, and a current mirror circuit including said one transistor, said current mirror circuit allowing a current corresponding to the collector current to flow in the collector of said one transistor.

5. A multistage variable gain amplifier circuit as claimed in claim 2, wherein said unbalanced output type differential amplifier has at least on e pair of transistors whose emitters electrically connected to a common constant-current source and supplied with a signal through the emitters thereof, said one transistor having a base supplied with an AGC voltage, said other transistor having a base electrically connected to ground via a bias source, and said one or other transistor having a collector for outputting a signal therefrom.

6. A multistage variable gain amplifier circuit as claimed in claim 5, wherein said first amplification degree control means includes a voltage-current converting transistor for translating a change in the AGC voltage applied to the base of said one transistor into a change in collector current, and a current mirror circuit including said one transistor, said current mirror circuit allowing a current corresponding to the collector current to flow in the collector of said one transistor.

* * * * *